SEMICONDUCTOR DEVICE

Original Filed Oct. 9, 1964 3 Sheets-Sheet 1

Inventors.
Yoshiyuki Kawana
Saburo Iwata by Hill, Sherman, Meroni, Gross & Simpson Attnys

SEMICONDUCTOR DEVICE

Original Filed Oct. 9, 1964 3 Sheets-Sheet 2

Mag: 200/1

Inventors
Yoshiyuki Kawana
Saburo Iwata by Hill, Sherman, Meroni, Gross & Simpson Attnys.

SEMICONDUCTOR DEVICE

Original Filed Oct. 9, 1964 3 Sheets-Sheet 3

Inventors
Yoshiyuki Kawana
Saburo Iwata by Hill, Sherman, Meroni, Gross & Simpson Attys United States Patent Office 3,555,373
Patented Jan. 12, 1971

3,555,373
SEMICONDUCTOR DEVICE
Yoshiyuki Kawana and Saburo Iwata, Tokyo, Japan, assignors to Sony Corporation, Tokyo, Japan, a corporation of Japan
Continuation of application Ser. No. 402,789, Oct. 9, 1964. This application Mar. 5, 1968, Ser. No. 710,683
Int. Cl. H01l 9/00
U.S. Cl. 317—234 7 Claims

ABSTRACT OF THE DISCLOSURE

A semiconductor device including a wafer of semiconductor material having charge carriers of one polarity and a central region having charge carriers of the other polarity. A ring of semiconductor material is disposed around the central region and spaced therefrom by a distance that permits the depletion regions of the central layer and the ring to merge without the application of the voltage to the device.

This invention relates generally to a semiconductor device and to a method of manufacturing the same, and more particularly to a planar-type diode or transistor having a characteristic of high breakdown voltage.

As is well known, in a planar transistor or diode, an edge of a junction at the crystal surface is covered with an oxide film, so that its fabrication and resultant characteristics are superior to Mesa-type diodes or transistors. However, the planar transistor or diode has a disadvantage of lower breakdown voltage. Initial breakdown of a planar transistor or diode when a reverse bias is applied thereto occurs at an edge of the p-n junction in the neighborhood of the wafer surface. Since the breakdown of the planar transistor or diode occurs at the edge portions of the junction, the breakdown characteristics of the entire device are dependent upon the characteristics at the edge of the junction.

It is well known that when an n-type and a p-type material are joined to form a semiconductor device, a rearrangement of mobile charge carriers occurs to form a depletion region at the junction. When a reverse bias is applied across the device, the voltage value of this bias is supported by the depletion region. Since the impurities in the semiconductor material provide the charge carriers therein, increasing the amount of such impurities will decrease the effective width of the depletion region.

The planar-type diode or transistor has the disadvantage of having a high concentration of impurities at the edges of the n-p junction. This concentration of impurities and consequently charge carriers reduces the effective width of the depletion region at the edge of the junction in the neighborhood of the wafer surface. It is apparent therefore that breakdown of the device will occur at the edge portions of the junction prior to a voltage breakdown at the remaining portions thereof. Other factors which contribute to the lower breakdown voltage at the edge portions of the junction are the geometric construction of the device, the respective surface levels of the wafer and the oxide film, the stress between the wafer and the oxide film and surface recombination.

Accordingly, it is one primary object of the present invention to provide a novel planar diode or transistor having a characteristic of high breakdown voltage.

It is another object of the present invention to provide a planar-type diode or transistor which is characterized by a guard junction and therefore has a characteristic of higher breakdown voltage than the prior art planar devices.

It is still another object of the present invention to provide a novel planar-type device which can be constructed with simple and economical techniques while maintaining all of the heretofore mentioned advantages.

Still another object of the present invention is to provide a novel method of manufacturing a planar-type diode or transistor having high breakdown voltage characteristics.

These and other objects of the present invention will be more fully realized and understood from the following detailed description when taken in conjunction with the accompanying drawings, wherein.

Figure 4A:
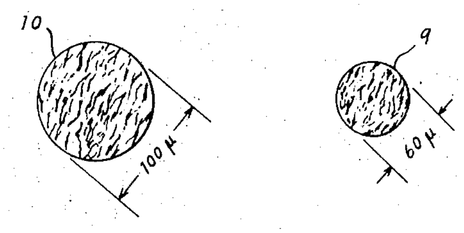
PRIOR ART FIG. 4A
Figure 4B:
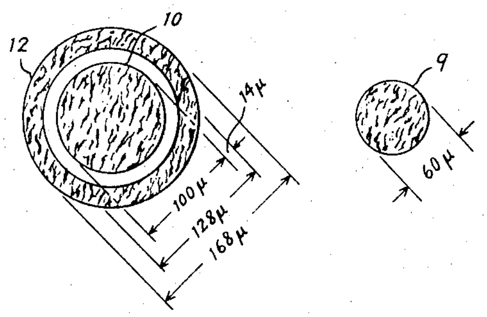
Figure 4C:
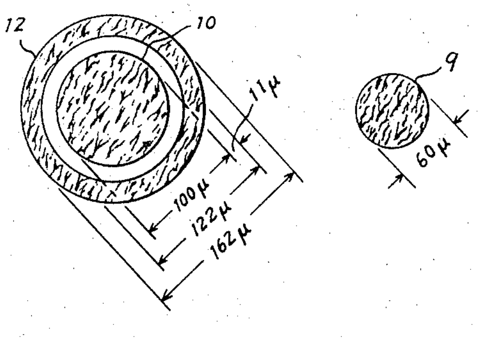
Figures 5A, 5B, 5C:
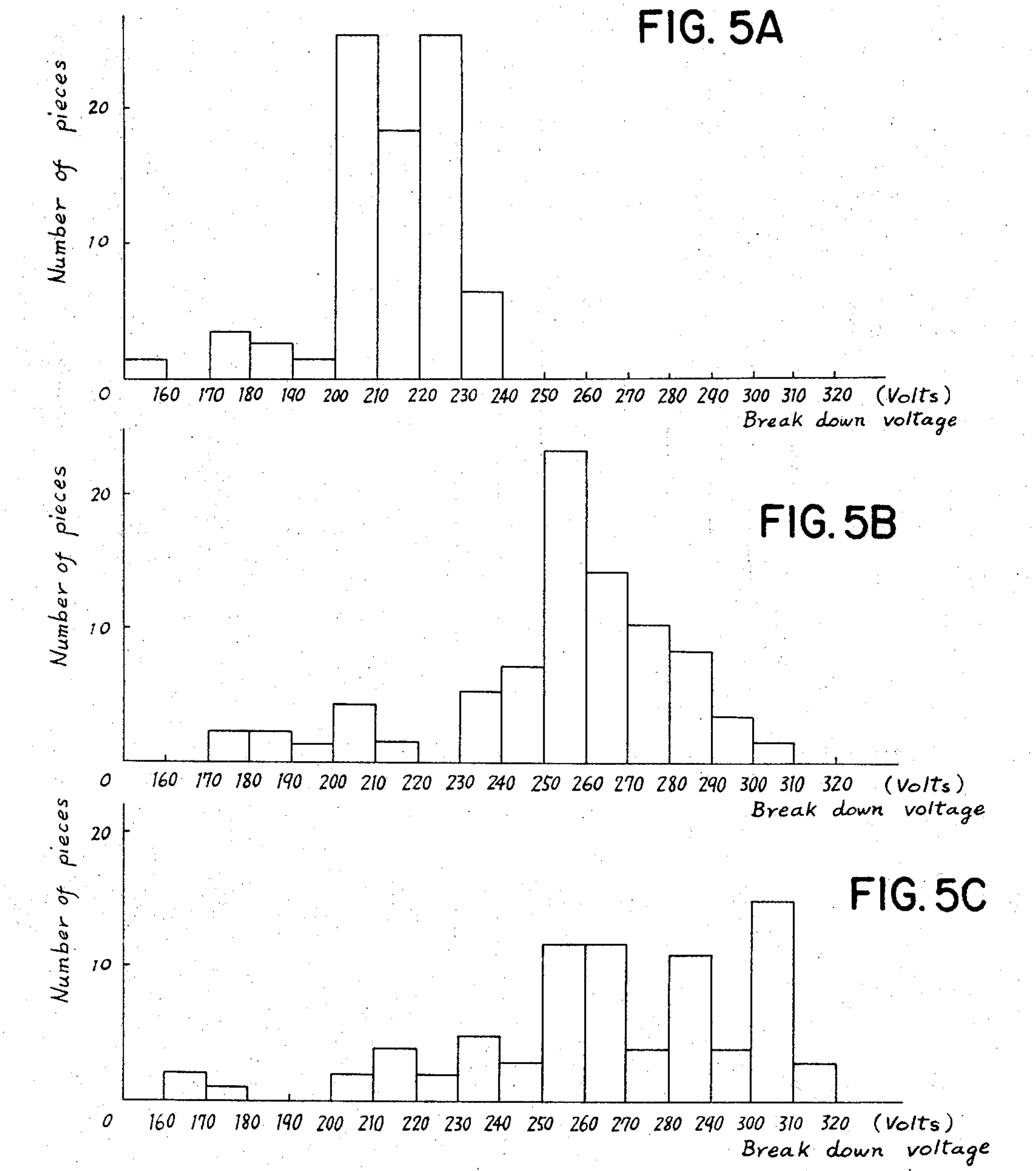

FIGS. 4–A to 4–C, inclusive, illustrate examples of patterns utilized in photoengraving methods for manufacturing a planar diode; and FIGS. 5–A to 5–C, inclusive, are graphs illustrating probability of breakdown occurrence of a number of planar diodes of the prior art and of the present invention.

Figure 1:
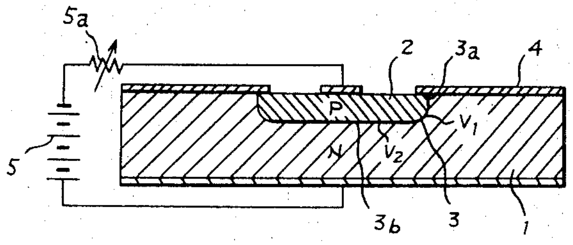
Fig-1 PRIOR ART:
FIG. 1 is a cross-sectional side view schematically illustrating a planar diode of the prior art.

With reference to the drawings in detail and in particular to FIG. 1, there is shown one example of a planar diode of the prior art. As illustrated therein, an n-type silicon wafer 1 has a p-type diffused layer 2 formed on a surface thereof to provide a p-n junction 3. An oxidized silicon film 4 extends over an edge of the p-n junction 3. The device is reversed biased with a DC source 5 connected thereto through a variable resistor 5a for varying the voltage drop across the device. When the voltage developed across the device is gradually increased, initial breakdown occurs at a portion 3*a* of the junction 3 near the surface of the wafer 1. This breakdown voltage of the junction edge 3*a* is of a significantly less value of voltage than that required for breakdown along the points at interior portions 3*b* of the junction 3. If this breakdown voltage at the portion 3*a* is $V_1$ in value, the breakdown voltage $V_2$ value at the portion 3*b* of the junction 3 is greater than $V_1$. Accordingly, the present invention is intended to minimize or eliminate the difference between $V_1$ and $V_2$.

Figure 3:
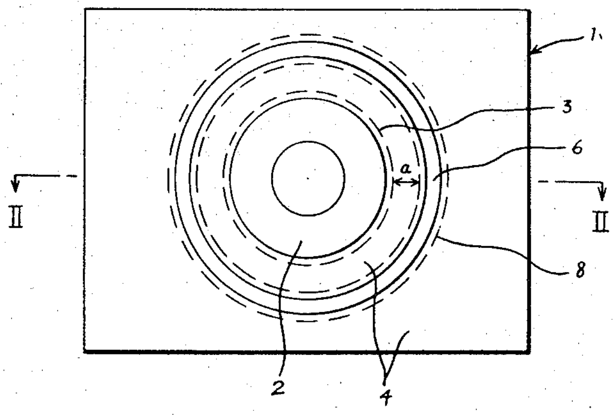
FIG. 3 is a top view of the device illustrated in FIG. 2.
Figure 2:
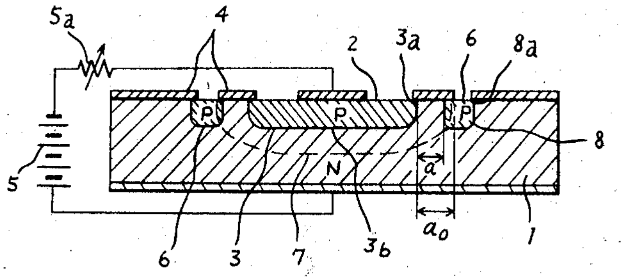
FIG. 2 is a cross-sectional side view taken along lines II—II of FIG. 3 schematically illustrating one preferred embodiment of a planar diode according to the present invention.

As previously discussed, breakdown occurs at the edge portions 3*a* of the junction 3 primarily because of the impurity concentration in that area. Since this impurity concentration tends to reduce the effective width of the depletion region, it can be seen that means which effectively increase the width of the depletion region at the edges thereof should be employed. Accordingly, in the present invention, a diffused ring 6 is formed on the semiconductive wafer 1 and encompasses the diffused layer 2 as illustrated in FIGS. 2 and 3. The conductivity or polarity of the charge carriers of the ring 6 is the same as that of the layer 2. That is, in the present exemplification, the ring 6 is of a p-type semiconductive material which forms a second p-n junction 8. It should be particularly noted, that the ring 6 and the p-n junction 8 are not provided with an electrode and are electrically isolated from the diode circuit.

The structure of the present invention is intended to obtain a higher breakdown voltage than previously exhibited in devices of the prior art. A distance *a* between the layer 2 and the ring 6 is selected to be smaller than a width $a_0$ of the depletion region, indicated by a dotted line 7, which is formed when the breakdown voltage $V_1$ is applied to the device. When the breakdown voltage $V_1$ is obtained, the depletion region extends into the p-n junction 8 formed by the ring 6 effectively increasing the depletion region width and, accordingly, the breakdown voltage at the junction 3*a* can obtain a value of $V_1$ plus $V_2$. As a result, the problem of low breakdown voltage at the surface of the device can be completely eliminated.

FIGS. 4–A to 4–C illustrate examples of mask patterns for fabricating a planar diode by photoengraving processes. FIG. 4–A shows a mask pattern of the prior art, FIG. 4–B is a mask pattern of the present invention wherein the distance *a* is selected to be 14 microns, and FIG. 4–C is another mask pattern of the present invention wherein *a* is 11 microns. The circles designated with the reference numeral 9 are mask patterns of respective electrodes to be attached to the layer 2. The center portion of the mask patterns designated with the reference numeral 10 corresponds to the layer 2 and the ring patterns, designated with the reference numeral 12 correspond to the ring layers.

In the manufacture of semiconductor devices of the present invention, the oxide film 4 is removed from the wafer 1 to provide exposed areas for the semiconductor layer 2 and the semiconductor ring 6. The distance between the layer 2 and the ring 6 is selected to be no greater than a width of the depletion region when the reverse bias is at a value of $V_1$. The semiconductive layer 2 and semiconductive ring 6 are then diffused into the wafer 1 for providing a semiconductor device having all of the advantages of the device illustrated in FIGS. 2 and 3.

FIG. 5–A illustrates the probability of breakdown occurrence of a silicon planar diode of the prior art manufactured by the use of the mask pattern illustrated in FIG. 4–A. As illustrated in FIG. 5–A, the breakdown voltage for conventional diodes of the prior art is primarily in the range between 200 to 230 volts. FIGS. 5–B and 5–C illustrate the probability of breakdown occurrence in the semiconductor devices of the present invention employing the mask patterns of FIGS. 4–B and 4–C respectively. As shown therein, voltages in excess of 230 can be employed before breakdown occurs. It is apparent from consideration of the graphs of breakdown probability that the present invention substantially increases the breakdown potential over that required for prior art semiconductor devices. It will be observed that the highest breakdown potential obtained with prior art devices did not exceed 240 volts, whereas with the teachings of the present invention, the larger number of breakdown occurrences resulted substantially above 240 volts.

The foregoing teachings have been made in connection with planar diodes, but it will be apparent to those skilled in the art that a planar transistor having a characteristic of high breakdown voltage can similarly be obtained by the present invention. Furthermore, it will be appreciated that the conductivity type of the semiconductive wafer and the diffused areas can be made opposite to that in the foregoing exemplifications and that a plurality of guard ring junctions 6 can be provided, if desired.

The principles of the invention explained in connection with the specific exemplifications thereon will suggest many other applications and modifications of the same. It is accordingly desired that, in construing the breadth of the appended claims they shall not be limited to the specific details shown and described in connection with the exemplifications thereof.

We claim as our invention:

1. A semiconductor device, comprising:

a wafer of semiconductor material having charge carriers of one polarity, a layer of semiconductor material having charge carriers of another polarity diffused on one surface of said wafer and forming a p-n junction with said wafer, a first depletion region formed between said wafer and said layer when a voltage $V_1$ is applied to said p-n junction, said first depletion region having a breakdown potential $V_1$ at edges thereof and a breakdown potential $V_2$ at the remaining portions thereof, potential $V_1$ being of lesser value than potential $V_2$, and a ring of semiconductor material having charge carriers of the other polarity diffused on said one surface of said wafer around a periphery of said layer and forming a p-n junction with said wafer, an inner periphery of said ring being disposed within the edges of said first depletion region, said ring and said first depletion region forming a second depletion region having a breakdown potential $V_3$ at edges thereof, an outer periphery of said ring having a dimension no greater than that required for the potential $V_3$ to be no more than the potential $V_1$ plus the potential $V_2$.

2. A semiconductor device as defined in claim 1, wherein said layer has a diameter of 100 microns.

3. A semiconductor device as defined in claim 2, wherein the inner diameter of said ring is equal to 128 microns and the outer diameter of said ring is equal to 168 microns.

4. A semiconductor device as defined in claim 2, wherein the inner diameter of said ring is equal to 122 microns and the outer diameter of said ring is equal to 162 microns respectively.

5. A semiconductor device as defined in claim 1, wherein the inner periphery of said ring is spaced a distance of 14 microns from the outer periphery of said layer.

6. A semiconductor device as defined in claim 1, wherein the inner periphery of said ring is spaced a distance of 11 microns from the outer periphery of said layer.

7. Electronic apparatus comprising:

a wafer of semiconductor material of a first conductivity type having first and second opposed surfaces;

a first region of a second conductivity type on the first surface of said wafer forming a first p-n junction therewith;

a second region of said second conductivity type on the first surface of said wafer forming a second p-n junction therewith which surrounds said first p-n junction in predetermined spaced relation;

a first electrode being disposed in ohmic contact with said first region;

a second electrode being disposed in ohmic contact with the second surface of said wafer of semiconductive material;

said second region being free of electrical connection;

a potential source connected to said first and second electrodes, said source reverse biasing said first p-n junction with a potential of such magnitude that a depletion layer extends from said first p-n junction to said second p-n junction.

References Cited

UNITED STATES PATENTS 3,335,296 8/1967 Smart ------------- 307—88.5

JOHN HUCKERT, Primary Examiner

R. F. POLISSACK, Assistant Examiner

U.S. Cl. X.R.

317—235